(12) United States Patent
Claridge et al.

(10) Patent No.: US 11,508,917 B2
(45) Date of Patent: Nov. 22, 2022

(54) IN SITU THERMAL CONTROL OF LANGMUIR-SCHAEFER TRANSFER

(71) Applicant: Purdue Research Foundation, West Lafayette, IN (US)

(72) Inventors: Shelley A. Claridge, Lafayette, IN (US); Tyler Hayes, Lafayette, IN (US); David McMillan, Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 29 days.

(21) Appl. No.: 16/904,716

(22) Filed: Jun. 18, 2020

(65) Prior Publication Data

US 2020/0321542 A1 Oct. 8, 2020

Related U.S. Application Data

(62) Division of application No. 16/038,231, filed on Jul. 18, 2018, now Pat. No. 10,756,278.

(60) Provisional application No. 62/533,687, filed on Jul. 18, 2017.

(51) Int. Cl.
*H01L 51/00* (2006.01)
*B05D 1/20* (2006.01)

(52) U.S. Cl.
CPC .......... *H01L 51/0075* (2013.01); *B05D 1/204* (2013.01); *B05D 1/208* (2013.01); *H01L 51/0012* (2013.01); *H01L 51/0026* (2013.01)

(58) Field of Classification Search
CPC ............ H01L 51/0075; H01L 51/0012; H01L 51/0026
See application file for complete search history.

(56) References Cited

U.S. PATENT DOCUMENTS

| 2010/0272993 | A1* | 10/2010 | Volinsky | B82Y 10/00 428/378 |
| 2012/0074127 | A1* | 3/2012 | Abbott | H05B 6/1272 219/486 |
| 2014/0042494 | A1* | 2/2014 | Han | H01L 29/42332 257/192 |

OTHER PUBLICATIONS

Bang et al. Sitting Phases of Polymerizable Amphiphiles for Controlled Functionalization of Layered Materials, Mar. 14, 2016, J. Am. Chem. Soc. 2016, 138, 4448-4457. (Year: 2016).*

* cited by examiner

*Primary Examiner* — Hai Y Zhang
(74) *Attorney, Agent, or Firm* — Purdue Research Foundation

(57) ABSTRACT

This invention generally relates to a method for preparing and transferring a monolayer or thin film. In particular this present invention is an improved version of the Langmuir-Schaefer technique for preparing and transferring a monolayer or thin film, incorporating in situ thermal control of the substrate during the transfer process.

11 Claims, 11 Drawing Sheets

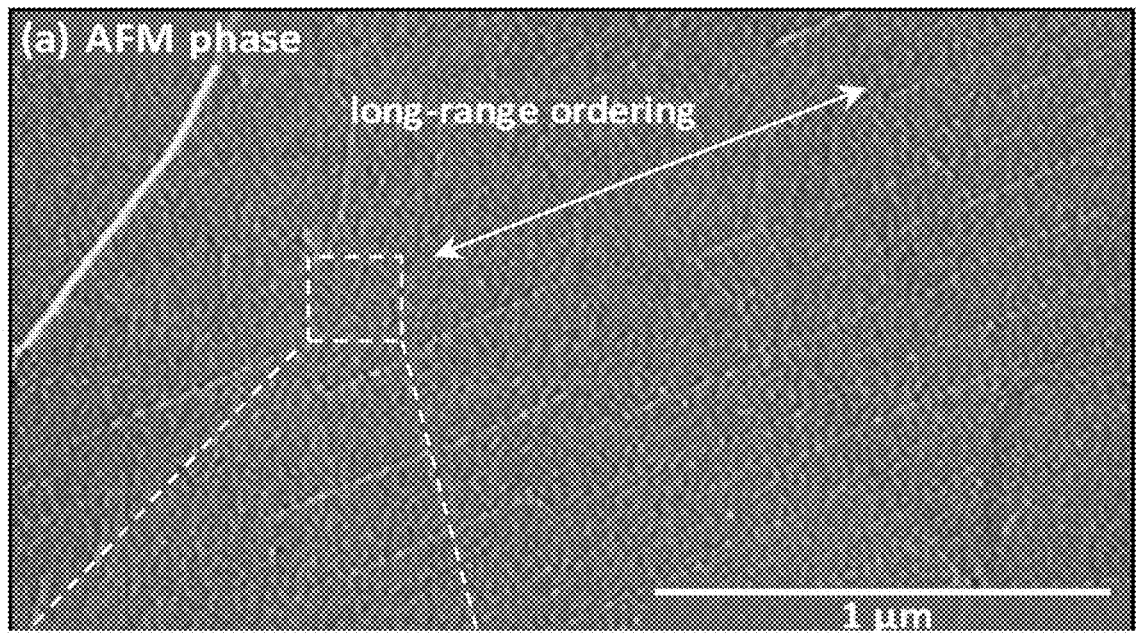
FIG. 6A
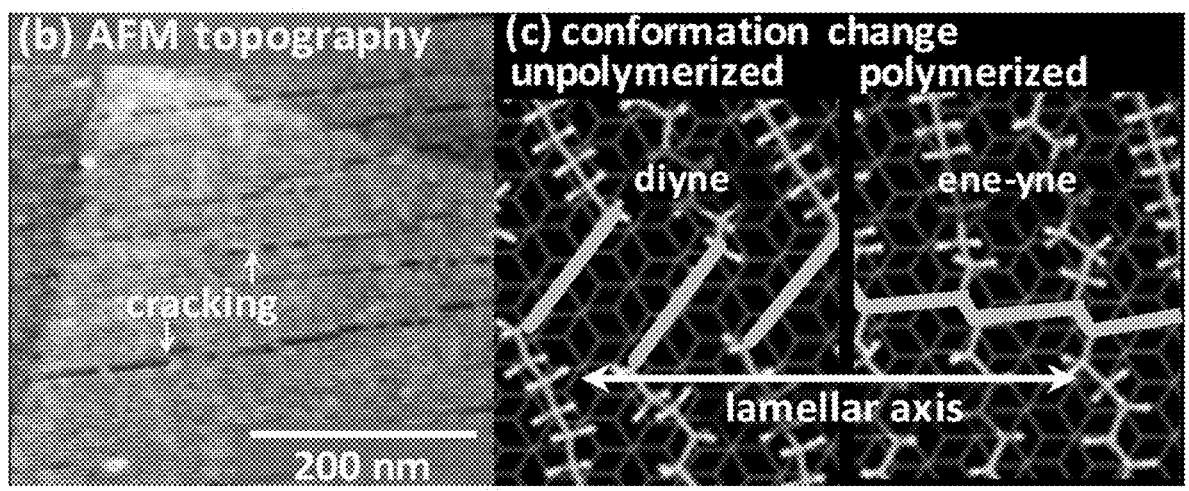
FIG. 6B                    FIG. 6C

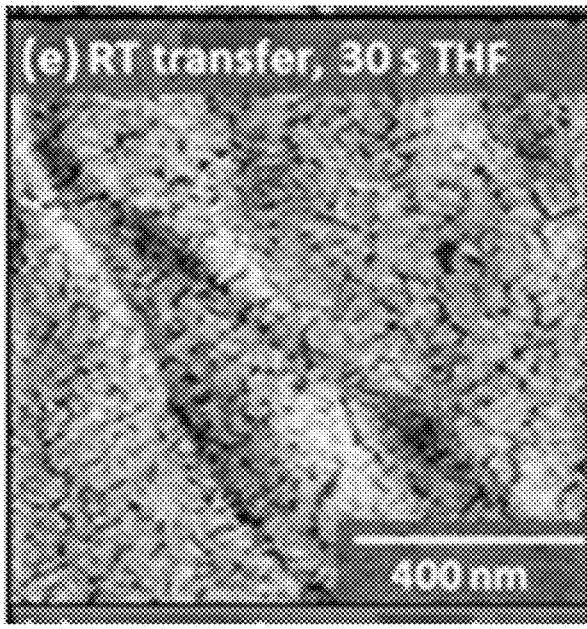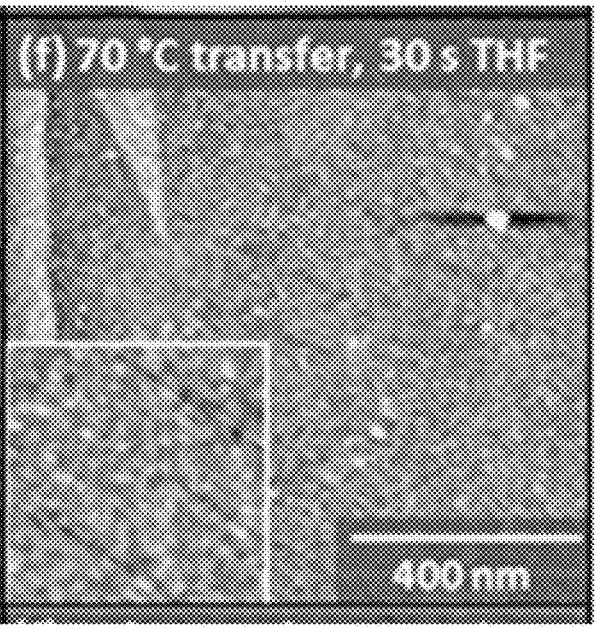
FIG. 7E  FIG. 7F
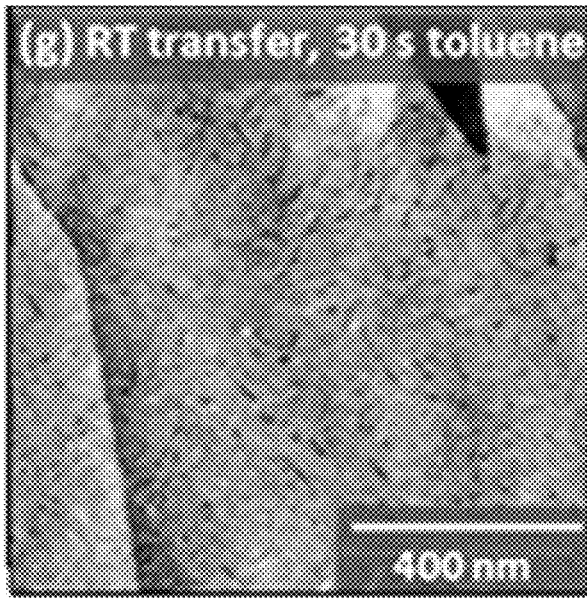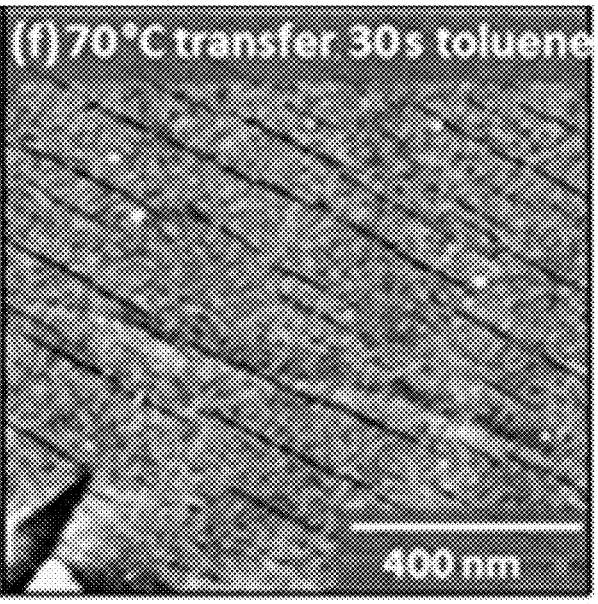
FIG. 7G  FIG. 7H

IN SITU THERMAL CONTROL OF LANGMUIR-SCHAEFER TRANSFER

CROSS REFERENCE TO RELATED APPLICATIONS

This present patent application a divisional application of U.S. Utility patent application Ser. No. 16/038,231, filed Jul. 18, 2018, which relates to and claims the priority benefit of U.S. Provisional Application Ser. No. 62/533,687, filed Jul. 18, 2017, the content of which is hereby incorporated herein by reference in its entirety.

GOVERNMENT RIGHTS

This invention was made with government support under grant No. CHE1555173, awarded by the National Science Foundation. The United States government has certain rights in the invention.

FIELD OF THE INVENTION

This invention generally relates to a method for preparing and transferring a monolayer or thin film. In particular this present invention is an improved version of the Langmuir-Schaefer technique for preparing and transferring a monolayer or thin film to a substrate, which incorporates in situ thermal control of the substrate in the transfer process.

BACKGROUND AND BRIEF SUMMARY

This section introduces aspects that may help facilitate a better understanding of the disclosure. Accordingly, these statements are to be read in this light and are not to be understood as admissions about what is or is not prior art.

Controlling surface functionalization of 2D materials has emerged as a major requirement in materials chemistry (Mann, J A et al., *J. Phys. Chem. Lett.* 2013, 4, 2649-2657; MacLeod, J M., et al., *Small* 2014, 10, 1038-1049). To preserve electronic conjugation within the 2D layer, substrates are often functionalized noncovalently (De Feyter, S. et al., *Chem. Soc. Rev.* 2003, 32, 139-150; Mali, K S, et al., *Nanoscale* 2015, 7, 1566-1585; Okawa, Y et al., *Nature* 2001, 409, 683-684); ligand-substrate interaction can then be used to control electronic structure (Georgakilas, V et al., *Chem. Rev.* 2012, 112, 6156-6214; Kuila, T, et al, *Prog. Mater. Sci.* 2012, 57, 1061-1105).

However, utilization of noncovalent monolayers in scalable industrial processes such as solution- and spray-coating elevates the importance of creating robust, solvent-stable films (Bang, J J, et al, *J. Am. Chem. Soc.* 2016, 138, 4448-4457; Choong, S W, et al., *ACS Appl. Mater. Interfaces* 2017, 9(22), 19326-19334). A significant body of work in other types of monolayers has demonstrated that desorption of molecules occurs orders of magnitude more rapidly at defects (Doudevski, I. et al, *Langmuir* 2000, 16, 9381-9384; Love, J C, et al., *Chem. Rev.* 2005, 105, 1103-1169), suggesting the importance of creating large ordered domains. Here, we report a process for increasing ordered domain areas substantially (over an order of magnitude for the molecules utilized here), using a modified Langmuir-Schaefer (LS) technique that enables in situ thermal control of the substrate during film preparation. We find that monolayers of polymerized diynoic phospholipids prepared in this way are stable toward vigorous washing with both polar and nonpolar solvents, including water, ethanol, tetrahydrofuran (THF), and toluene, suggesting practical utility in applications that require solution processing.

Classical Langmuir-Schaefer (LS) transfer protocols have been utilized since the 1930s to transfer standing phases of amphiphiles to solid substrates (Langmuir, I, et al., *J. Am. Chem. Soc.* 1938, 60, 1351-1360). In this process, a monolayer of amphiphiles is pre-assembled on an aqueous subphase, and a (usually hydrophobic) substrate is lowered onto the molecular film and withdrawn, transferring molecules to the substrate. Although conventionally utilized to transfer standing phase films (Castellana, E T, et al., *Surf. Sci. Rep.* 2006, 61, 429-444), LS transfer can also be used to convert standing monolayers on the aqueous subphase into lying-down phases on 2D materials such as highly ordered pyrolytic graphite (HOPG) (Okawa, Y, et al, *J. Chem. Phys.* 2001, 115, 2317-2322; Giridharagopal, R. et al., *J. Phys. Chem. C* 2007, 111, 6161-6166).

In classic LS transfer of standing phases, transferred molecules retain their original ordering; thus, transferring from tightly packed source films minimizes defects (Ninks, B P, *Adv. Colloid Interface Sci.* 1991, 34, 343-432; Honig, E P, et al., *J. Colloid Interface Sci.* 1973, 45, 92-102). In contrast, in Langmuir-Schaefer transfer involving conversion of standing phases to lying-down phases, each molecule must rotate up to 90° from its initial orientation in the source film to form the horizontally-oriented monolayer (FIG. 1, top left). A LS transfer technique involving conversion is a convenient method to prepare surfaces for scanning probe studies of noncovalent monolayers (e.g. diynoic acids) (Okawa, Y, et al, *J. Chem. Phys.* 2001, 115, 2317-2322; Giridharagopal, R. et al., *J. Phys. Chem. C* 2007, 111, 6161-6166; Okawa, Y. et al., *Nanoscale* 2012, 4, 3013-3028), in which typical domain edge lengths are on the order of ~100 nm. If adequate control were developed over the conversion process, it could represent a useful means of controlling film structure over length scales from nm to cm.

However, LS transfer involving conversion of standing phases to lying-down phases is both mechanistically more complex and less well understood than classic LS transfer of standing phases; our experience and that of others (Grim, P C M, et al, *Angew. Chem. Int. Ed.* 1997, 36, 2601-2603) suggests that transfer efficiency and ordering of lying-down phases created using this technique can be quite variable. Further improvement of LS technique is needed to handle transfer involving conversion of standing phases to lying-down phases.

Here, we disclose a process for increasing ordered domain areas substantially (over an order of magnitude for the molecules utilized here), using a modified Langmuir-Schaefer (LS) technique that enables in situ thermal control of the substrate during film preparation. We discovered that monolayers of polymerized diynoic phospholipids prepared in this way are stable toward vigorous washing with both polar and nonpolar solvents (including water, ethanol, tetrahydrofuran (THF), and toluene), suggesting utility in applications that require solution processing.

SUMMARY OF THE INVENTION

This invention generally relates to a method for preparing and transferring a monolayer or thin film. In particular this present invention is an improved version of the Langmuir-Schaefer technique for preparing and transferring a monolayer or thin film to a substrate, which incorporates in situ thermal control of the substrate during the transfer process.

In some aspects, this invention relates to an improved Langmuir-Schaefer (LS) method for preparing and transferring a monolayer or thin film comprising the steps of
  a) preparing a solution of a component material for a monolayer;
  b) interfacially trapping a monolayer at an air-water interface;
  c) preparing a supporting substrate;
  d) preparing a heating and temperature control system that is operatively connected to the supporting substrate; and
  e) transferring the monolayer of step b) to the supporting substrate of step c) with continuous heating at a controlled temperature during the transfer of said monolayer.

In another aspect, this invention relates to an improved LS method for preparing and transferring a monolayer or thin film, wherein the improvement comprises the step of controlling substrate temperature during the transfer of said monolayer or thin film.

In some other embodiments, this invention relates to an improved LS method for preparing and transferring a monolayer or thin film, wherein the improvement comprises the step of in situ thermal annealing using a heated substrate during the transfer of said monolayer or thin film.

In some illustrative embodiments, this invention relates to an improved LS method for preparing and transferring a monolayer or thin film, wherein the supporting substrate is connected to a heating and temperature control mechanism by a magnetic force.

In some embodiments, the present invention relates to a method for transferring a monolayer or a thin film disclosed herein, wherein the heating and temperature control is operative at an elevated temperature ranging from about 25° C. to about 250° C., which is limited only by the physical/chemical stability of said monolayer or thin film and the medium used for the preparation of said monolayer or thin film.

In some other embodiments, the medium used for the preparation of said monolayer or thin film may be water, an aqueous solution of organic or inorganic salt, a mixed solution of two or more solvents, or a buffered aqueous solution.

In some preferred embodiments, the present invention relates to a method for transferring a monolayer or a thin film disclosed herein, wherein the heating and temperature control is operative in the range from about 30° C. to about 90° C., wherein the thin film or monolayer is prepared at the interface of air and an aqueous medium.

In some embodiments, the present invention relates to a method for transferring a monolayer or a thin film as disclosed herein, wherein heating is provided by means of either pre-heating of the supporting substrate or continuous heating at a constant temperature throughout the transfer process.

In some other embodiments, this invention relates to an improved LS method for preparing and transferring a monolayer or thin film, wherein the heating and temperature control is operative in the range from about 30° C. to about 90° C.

In some illustrative embodiments, this invention relates to an improved LS method for preparing and transferring a monolayer or thin film, wherein the supporting substrate is provided by a batch wise operation or a continuous operation.

In some illustrative embodiments, this invention relates to an improved LS method for preparing and transferring a monolayer or thin film, wherein the supporting substrate is graphene, highly ordered pyrolytic graphite (HOPG), or another layered material including $MoS_2$, $WS_2$, and the like.

In some illustrative embodiments, this invention relates to a monolayer or thin film prepared by an improved Langmuir-Schaefer (LS) method comprising the steps of
  a) preparing a solution of a component material for a monolayer or thin film;
  b) interfacially trapping a monolayer or thin film at an air-water interface;
  c) preparing a supporting substrate;
  d) preparing a heating and temperature control mechanism that is operatively connected to the supporting substrate; and
  e) transferring the monolayer or thin film of step b) to the supporting substrate of c) with heating at a controlled temperature during the transfer of said monolayer or thin film.

In some illustrative embodiments, this invention relates to a monolayer or thin film prepared by an improved LS method, wherein the supporting substrate is connected to a heating and temperature control mechanism by a magnetic force.

In some preferred embodiments, this invention relates to a monolayer or thin film prepared by an improved LS method, wherein the heating and temperature control is operative in the range from about 30° C. to about 90° C.

In some illustrative embodiments, this invention relates to a monolayer or thin film prepared by an improved LS method, wherein the supporting substrate is provided by a batch wise operation or a continuous operation.

In some illustrative embodiments, this invention relates to a monolayer or thin film prepared by an improved LS method, wherein the supporting substrate is graphene, highly ordered pyrolytic graphite (HOPG), or another layered material including $MoS_2$, $WS_2$, and the like.

In some illustrative embodiments, this invention relates to a monolayer or thin film prepared by an improved LS method, wherein said monolayer or thin film is used to control orientation and/or phase segregation of a block copolymer.

In some illustrative embodiments, this invention relates to a monolayer or thin film prepared by an improved LS method, wherein said monolayer or thin film is used to control orientation and/or phase segregation of a block copolymer used for a photovoltaic device.

In some illustrative embodiments, this invention relates to a monolayer or thin film prepared by an improved LS method, wherein said monolayer or thin film is transferred to a flexible substrate for a wearable electronic device.

In some illustrative embodiments, this invention relates to a monolayer or thin film prepared by an improved LS method, wherein said monolayer or thin film is used to create stacked films of the same or different kind.

In some illustrative embodiments, this invention relates to a monolayer or thin film prepared by an improved LS method, wherein said monolayer or thin film is used to create a stacked film for an organic light emitting diode.

In some illustrative embodiments, this invention relates to a device for preparing and transferring a monolayer or thin film by an improved LS method, wherein said device comprises
  a) a heater body;
  b) a temperature control means; and
  c) a substrate for transferring said monolayer or thin film, wherein the substrate is operatively connected the heater body and temperature control, and the temperature of said substrate is controlled.

BRIEF DESCRIPTION OF THE DRAWINGS

Embodiments of the present disclosure will now be described by way of example in greater detail with reference to the attached Figs., in which:

FIG. 3A shows a film transferred at room temperature for 4 minutes, then subjected to ambient thermal annealing for 60 minutes at 50° C., which affords FIG. 3B. FIG. 3C shows a film transferred to an HOPG surface pre-heated, then allowed to cool rapidly to the subphase temperature during 1 minute transfer (fast quench). FIG. 3D depicts a high-resolution image from the area shown in FIG. 3C, illustrating small domain sizes and presence of standing phase. FIG. 3E shows a film transferred with the substrate preheated and held at a set-point temperature of 50° C. throughout a 1-minute transfer (in situ thermal control). FIG. 3F depicts high-resolution image from area shown in FIG. 3E, illustrating a larger domain size.

FIG. 4A shows that water condensed on room temperature HOPG surface impedes film formation; FIG. 4B shows that drying surface facilitates formation of alkyl-π van der Waals contacts, increasing transfer.

FIGS. 6A-6D show AFM images of long-range ordering. FIG. 6A depicts representative phase image illustrating molecular ordering over multiple μm, including over step edges in HOPG. FIG. 6B is a topography image from highlighted in 6A, illustrating cracks formed in monolayer during polymerization. FIG. 6C shows a molecular model of change in diyne PE monolayer structure during polymerization, leading to cracking defects visible in (FIGS. 6A-6B). FIG. 6D is a SEM image of transferred diyne PE film, illustrating typical domain sizes.

FIGS. 7A-7H depict AFM images of diyne PE films before and after 30 s washing with deionized water (FIGS. 7A, 7B), ethanol (FIGS. 7C, 7D), tetrahydrofuran (FIGS. 7E, 7F), and toluene (FIGS. 7G, 7H).

DETAILED DESCRIPTION

Figure 1:
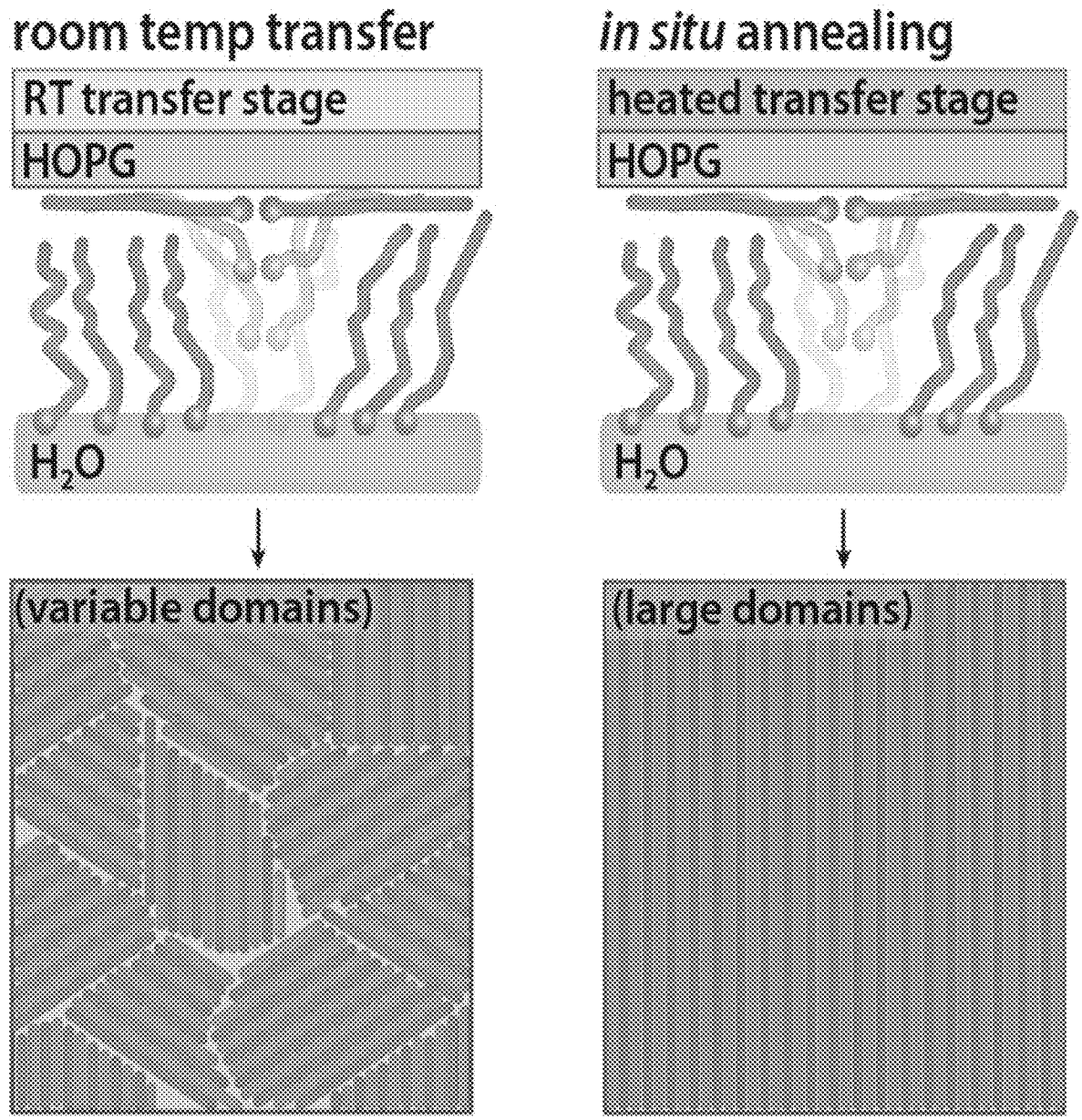
FIG. 1 depicts Langmuir-Schaefer (LS) transfer involving conversion of standing phases to lying-down phases to create horizontally-oriented monolayer structures, with (right panel) and without (left panel) in situ thermal control of the substrate.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure the term "about" can allow for a degree of variability in a value or range, for example, within 20%, within 10%, within 5%, or within 1% of a stated value or of a stated limit of a range.

In the present disclosure the term "substantially" can allow for a degree of variability in a value or range, for example, within 70%, within 80%, within 90%, within 95%, or within 99% of a stated value or of a stated limit of a range.

A layered, or two-dimensional (2D) material generally has a layer thickness between one atomic layer and a few nm. Even though the existence of two-dimensional materials have been theorized since the 1940's (Wallace, P. R. The band theory of graphite. *Phys. Rev.* 71, 622-634 (1947)), it was not until 2004 that it was shown that these materials can be stable as freestanding sheets, by the isolation of individual graphene sheets (Novoselov, K. S. et al., Science 306, 666-669 (2004)). Layers may be stacked to form macroscopic materials; for instance, highly oriented pyrolytic graphite (HOPG) consists of stacks of graphene layers.

This invention generally relates to a method for preparing and transferring a monolayer or thin film to a substrate. In particular this present invention is an improved version of the Langmuir-Schaefer technique for preparing and transferring a monolayer or thin film to a substrate, which incorporates in situ thermal control of the substrate during the transfer process.

In some illustrative embodiments, this invention relates to an improved Langmuir-Schaefer (LS) method for preparing and transferring a monolayer or thin film comprising the steps of a) preparing a solution of a component material for a monolayer or thin film;
b) interfacially trapping a monolayer or thin film at an air-water interface;
c) preparing a supporting substrate;
d) preparing a heating and temperature control mechanism that is operatively connected to the supporting substrate; and
e) transferring the monolayer or thin film of step b) to the supporting substrate of c) with heating at a controlled temperature during the transfer of said monolayer or thin film.

In some other embodiments, this invention relates to an improved LS method for preparing and transferring a monolayer or thin film, wherein the improvement comprises the step of in situ thermal control of the substrate during the transfer of said monolayer or thin film.

In some illustrative embodiments, this invention relates to an improved LS method for preparing and transferring a monolayer or thin film, wherein the supporting substrate is connected to a heating and temperature control mechanism by a magnetic force.

In some embodiments, the present invention relates to a method for transferring a monolayer or a thin film disclosed herein, wherein the heating and temperature control is operative at an elevated temperature ranging from about 25° C. to about 250° C., which is limited only by the physical/chemical stability of said monolayer or thin film and the medium used for the preparation of said monolayer or thin film.

In some embodiments, the medium used for the preparation of said monolayer or thin film may be water, an aqueous solution of organic or inorganic salt, a mixed solution of two or more solvents, or a buffered aqueous solution of various salts.

In some preferred embodiments, the present invention relates to a method for transferring a monolayer or a thin film disclosed herein, wherein the heating and temperature control is operative in the range from about 30° C. to about 90° C., wherein the thin film or monolayer is prepared at the interface of air and an aqueous medium.

In some embodiments, the present invention relates to a method for transferring a monolayer or a thin film as disclosed herein, wherein heating is provided by means of either pre-heating of the supporting substrate or continuous heating at a constant temperature throughout the transfer process.

In some illustrative embodiments, this invention relates to an improved LS method for preparing and transferring a monolayer or thin film, wherein the heating and temperature control is operative in the range from about 30° C. to about 90° C.

In some illustrative embodiments, this invention relates to an improved LS method for preparing and transferring a monolayer or thin film, wherein the supporting substrate is provided by a batch wise operation or a continuous operation.

In some illustrative embodiments, this invention relates to an improved LS method for preparing and transferring a monolayer or thin film, wherein the supporting substrate is graphene, highly ordered pyrolytic graphite (HOPG), or a layered material such as $MoS_2$ or $WS_2$.

In some illustrative embodiments, this invention relates to a monolayer or thin film prepared by a method comprising the steps of
 a) preparing a solution of a component material for a monolayer or thin film;
 b) interfacially trapping a monolayer or thin film at an air-water interface;
 c) preparing a supporting substrate;
 d) preparing a heating and temperature control mechanism that is operatively connected to the supporting substrate; and
 e) transferring the monolayer or thin film of step b) to the supporting substrate of c) with heating at a controlled temperature during the transfer of said monolayer or thin film.

In some illustrative embodiments, this invention relates to a monolayer or thin film prepared by an improved LS method, wherein the supporting substrate is connected to a heating and temperature control mechanism by a magnetic force.

In some preferred embodiments, this invention relates to a monolayer or thin film prepared by an improved LS method, wherein the heating and temperature control is operative in the range from about 30° C. to about 90° C.

In some illustrative embodiments, this invention relates to a monolayer or thin film prepared by an improved LS method, wherein the supporting substrate is provided by a batch wise operation or a continuous operation.

In some illustrative embodiments, this invention relates to a monolayer or thin film prepared by an improved LS method, wherein the supporting substrate is graphene, highly ordered pyrolytic graphite (HOPG), or a layered material such as $MoS_2$ or $WS_2$.

In some illustrative embodiments, this invention relates to a monolayer or thin film prepared by an improved LS method, wherein said monolayer or thin film is used to control orientation and/or phase segregation of a block copolymer.

In some illustrative embodiments, this invention relates to a monolayer or thin film prepared by an improved LS method, wherein said monolayer or thin film is used to control orientation and/or phase segregation of a block copolymer used for a photovoltaic device.

In some illustrative embodiments, this invention relates to a monolayer or thin film prepared by an improved LS method, wherein said monolayer or thin film is transferred to a flexible substrate for a wearable electronic device.

In some illustrative embodiments, this invention relates to a monolayer or thin film prepared by an improved LS method, wherein said monolayer or thin film is used to create stacked films of the same or different kind.

In some illustrative embodiments, this invention relates to a monolayer or thin film prepared by an improved LS method, wherein said monolayer or thin film is used to create a stacked film for an organic light emitting diode.

In some illustrative embodiments, this invention relates to a device for preparing and transferring a monolayer or thin film by an improved LS method, wherein said device comprises
 a) a heater body;
 b) a temperature control; and
 c) a substrate for transferring said monolayer or thin film, wherein the substrate is operatively connected the heater body and temperature control, and the temperature of said substrate is controlled.

The following Examples are intended to illustrate the above invention and should not be construed as to narrow its scope. One skilled in the art will readily recognize that the Examples suggest many other ways in which the invention could be practiced. It should be understood that numerous variations and modifications may be made while remaining within the scope of the invention.

Figure 2:
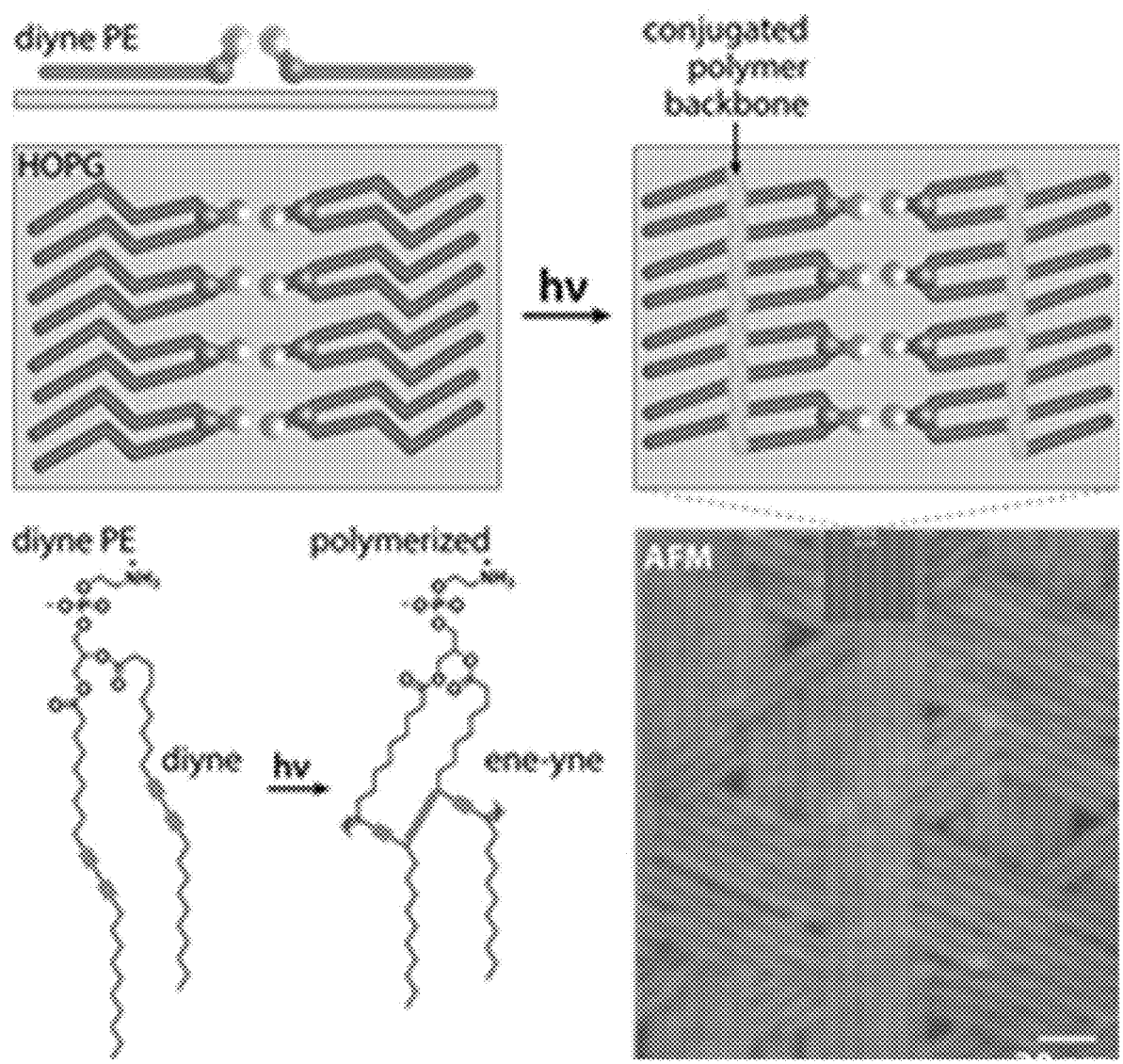
FIG. 2 shows the detailed chemical structures and an AFM (Atomic Force Microscope) image of a monolayer disclosed in this invention before and after UV-initiated polymerization.

Structure of striped noncovalent monolayers. For these studies, we utilized a polymerizable amphiphile, 1,2-bis(10,12-tricosadiynoyl)-sn-glycero-3-phosphoethanolamine (diyne PE, FIG. 2), which is known to form horizontally-oriented phases on HOPG, with sub-nm headgroup ridges conducive to visualization of lamellar structure via AFM imaging. In our experience, dual-chain amphiphiles exhibit greater native stability toward solvent washing (in comparison with single-chain amphiphiles such as 10,12-pentacosadiynoic acid), so they also present a useful test system for the further impacts of annealing on stability toward solution processing.

Figures 3A, 3B:
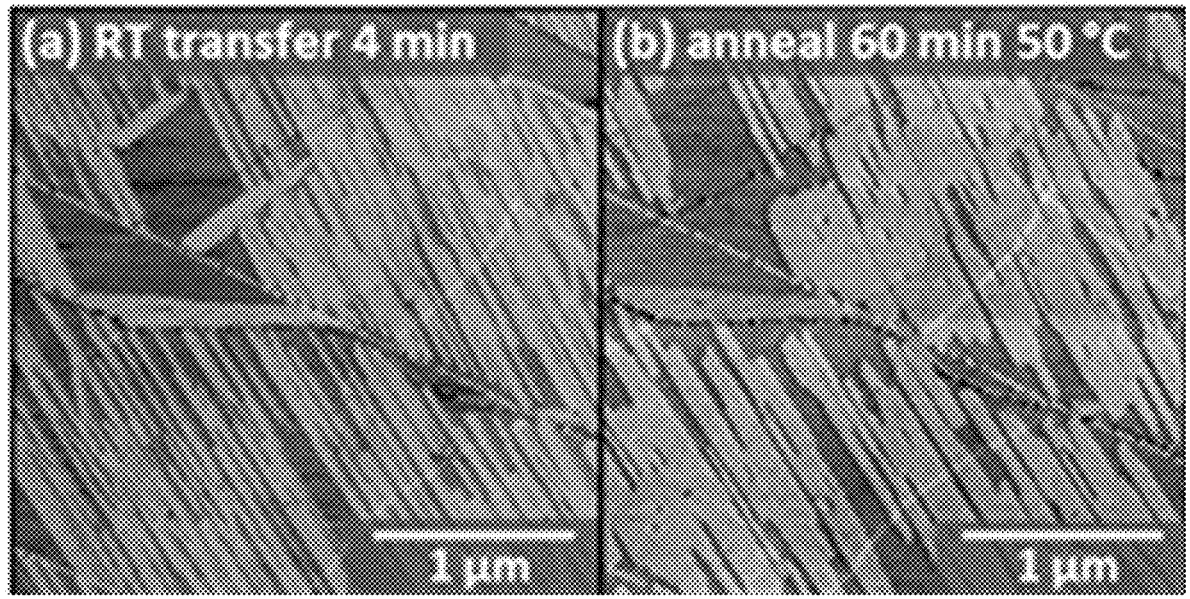
FIGS. 3A-3F show AFM images of diyne PE films.

Typical results for transfer of diyne PE to a room temperature HOPG substrate are shown in FIG. 3A. While domain lengths are frequently 100-1000 nm, a significant fraction of the surface lacks ordered domain structure, and in practice a variety of domain structures, aspect ratios, and coverage may be observed across a single substrate (typical substrate dimensions 10 mm×10 mm). Because thermal annealing is commonly employed to increase order in standing phase monolayers (Love J C, et al, *Chem. Rev.* 2005, 105, 1103-1169; Donhauser, Z J, et al., *J. Am. Chem. Soc.* 2003, 125, 11462-11463), we tested the effects of heating pre-assembled molecular films (FIG. 3B). After 60 minutes of annealing at 50° C. (a temperature chosen to maximize molecular mobility while minimizing thermal polymerization), many of the narrow domains have merged, but significant vacancies remain, even between very narrow, nominally relatively unstable domains. Although annealing somewhat improves domain ordering and size, it is advisable to limit exposure to elevated temperatures in order to minimize thermal polymerization (Chance, R R, et al., *J. Am. Chem. Soc.* 1978, 100, 1307-1309), precluding multi-hour annealing processes commonly employed to improve ordering in standing phase monolayers of alkanethiols (Love, J C, et al, 2005). Therefore, we examined additional possibilities for improving molecular ordering and domain size.

Postulating that increased temperatures during monolayer transfer might lower energetic barriers to molecular ordering, we compared two approaches: (1) elevating the substrate temperature prior to transfer, then allowing it to equilibrate to the temperature of the aqueous subphase (fast quench, FIG. 3C and d) and (2) elevating the substrate temperature prior to transfer, and maintaining a specified temperature throughout transfer (in situ annealing, FIGS. 3E and 3F). The transfer process places the relatively small HOPG substrate (typical dimensions 1 cm×1 cm×1 mm) in contact with the large thermal mass of the aqueous subphase. Thus, to enable the second approach, we designed and fabricated a temperature-controlled transfer stage that was suspended from the automated dipper on a commercial Langmuir trough and utilized for the experiments discussed below. When mounted on the transfer stage, the sample temperature is maintained at a desired setpoint by placing it in contact with an aluminum cylinder with an embedded cartridge heater regulated by a PID controller.

Figures 3C, 3D:
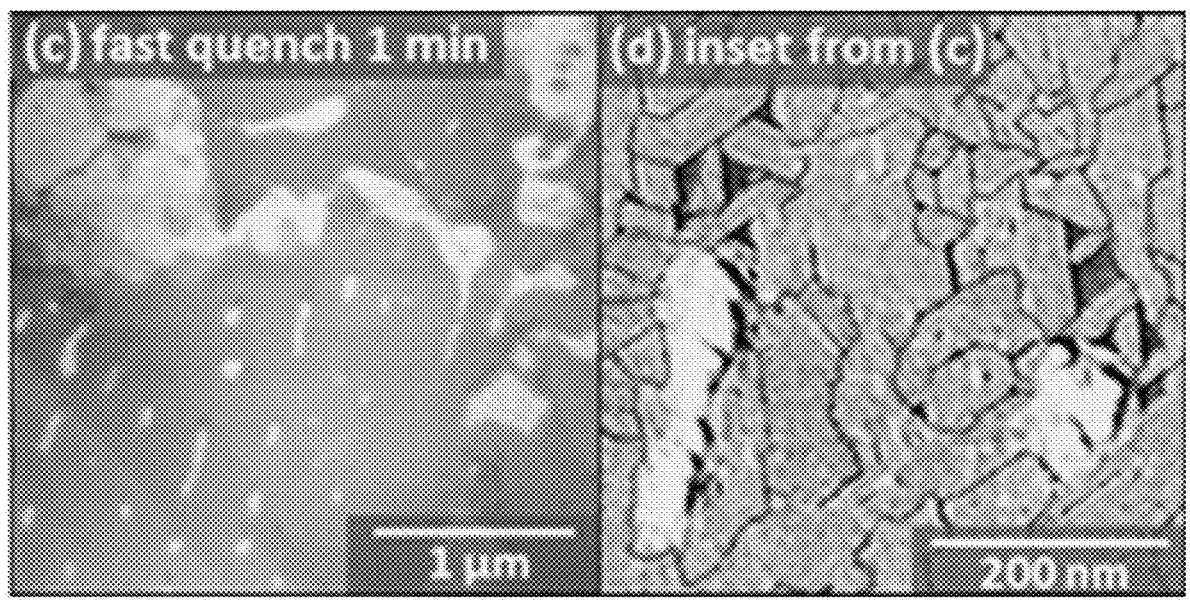
Figures 3E, 3F:
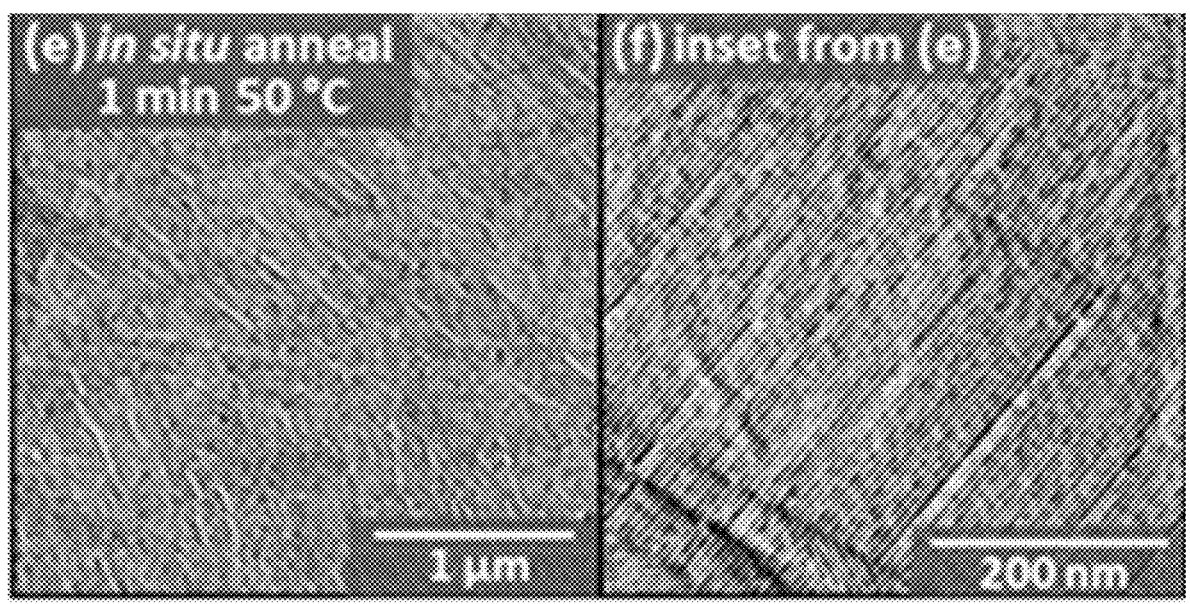

The results of fast-quench Langmuir-Schaefer conversion are shown in FIGS. 3C and 3D. Here, the HOPG substrate was pre-heated to 90° C., then loaded on the standard (non-heated) dipper and slowly lowered onto the subphase; typical substrate temperatures at the time of contact are in the range of 50-70° C., with some variability induced by factors including HOPG thickness (which changes each time the HOPG is cleaved). Transferred films contained domains with curved edges (FIG. 3C), very different than those typically observed in room temperature transfer. Higher-resolution imaging reveals a mixture of lying-down phases (FIG. 3D, striped regions) and standing phase (FIG. 3D, lighter regions) domains, presumably reflecting local molecular density variations in the subphase monolayer. In FIG. 3D, contrast is adjusted at domain edges as a guide to the eye (see Supporting Information for original image). Domains assembled through fast-quench transfer are typically quite small (~60 are visible in an area with an edge length of 500 nm in FIG. 3D), consistent with fast transfer and limited diffusion (Doudevski, I., et al, *Physical Review B* 1999, 60, 14-17). Overall, the transfer density increases by a factor of 2-3 in comparison with films transferred to a room temperature substrate.

Figure 4A:
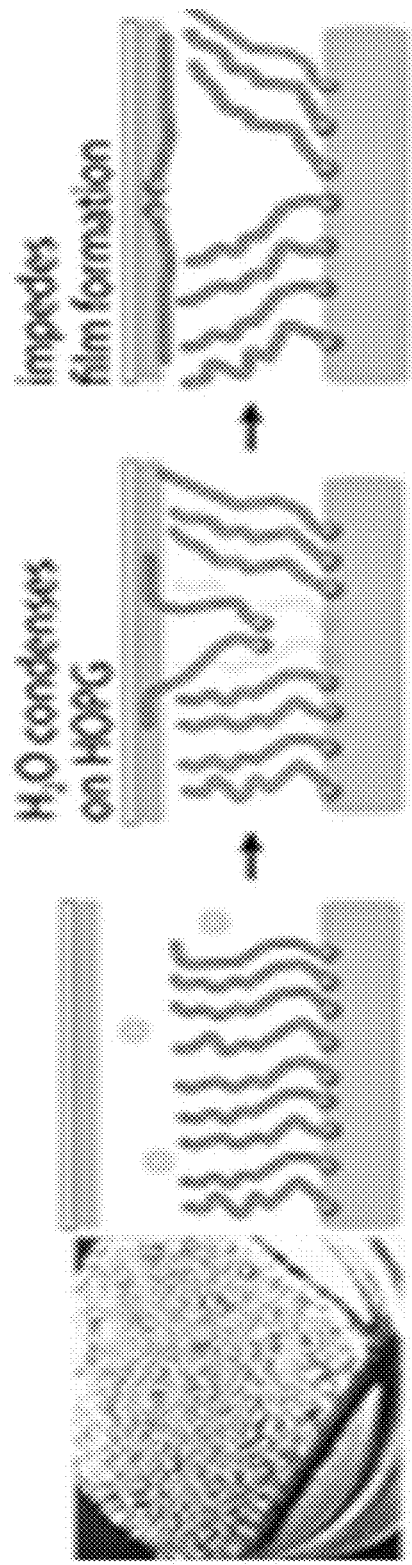
FIGS. 4A-4B illustrate the impact of heating HOPG surface on transferred monolayer structure.
Figure 4B:
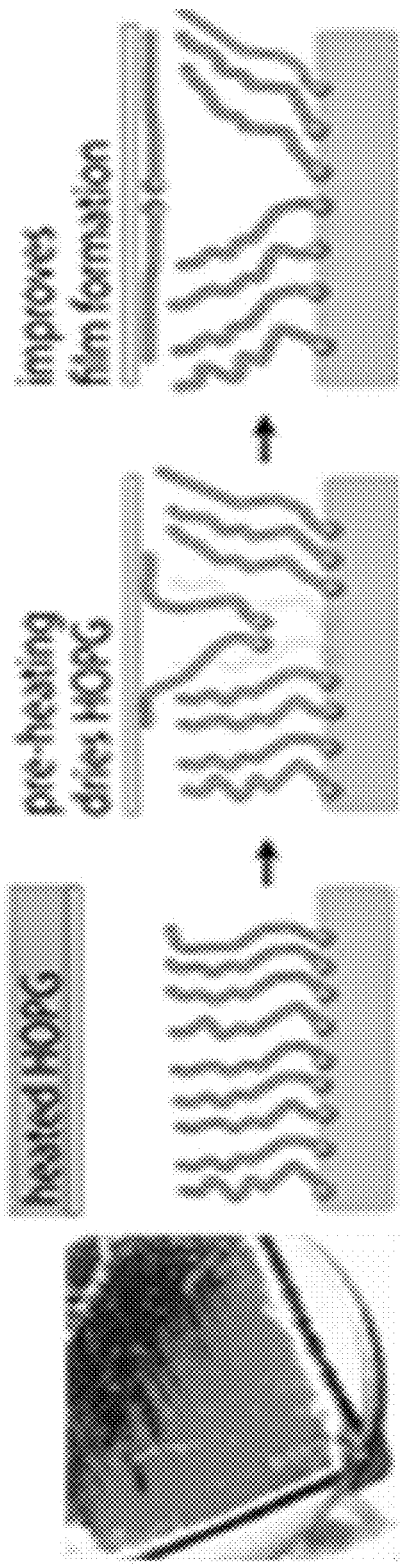

The increased surface coverage and transfer rate observed when using the fast-quench protocol vs. room-temperature transfer are consistent with drying of the HOPG surface upon pre-heating (FIGS. 4A-4B). Although HOPG is not especially hydrophilic, the substrate spends 1-5 minutes in the high-humidity environment above the aqueous subphase prior to contact during dipping, and we have observed that droplets of water can begin to condense on the surfaces of room-temperature samples prior to contact with the subphase (FIG. 4A, top left). Drying the surface would be expected to increase molecular transfer rates by facilitating formation of van der Waals contacts between alkyl chain termini and the HOPG.

In contrast, when the substrate is preheated to 50° C. and maintained at a set point temperature of 50° C. throughout transfer, full coverage and relatively large ordered lamellar domains are observed (FIGS. 3E and 3F), consistent with Ostwald ripening (Doudevski, I., et al, *Physical Review B* 1999, 60, 14-17; Poirier, G E, et al, *J. Phys. Chem.* 1995, 99, 10966-10970).

Examination of Transfer Differences Versus Dipper Temperature.

Figures 5A, 5B:
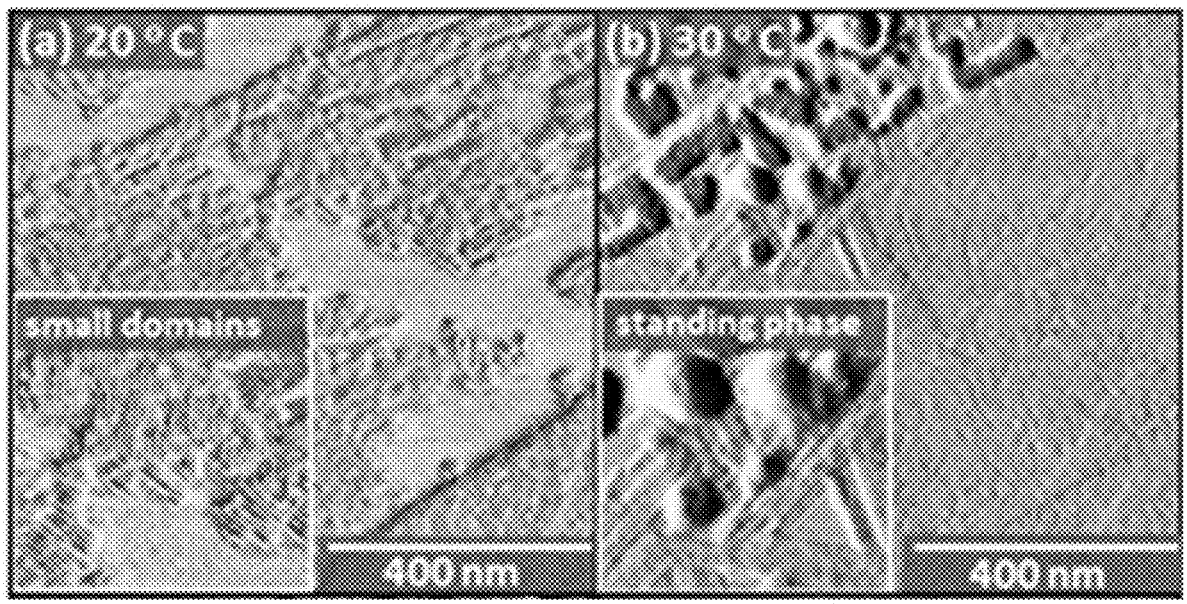
FIGS. 5A-5H show AFM images of diyne PE films transferred at stage setpoint temperatures of (FIG. 5A) 20° C., (FIG. 5B) 30° C., (FIG. 5C) 40° C., (FIG. 5D) 50° C., (FIG. 5E) 60° C., (FIG. 5F) 70° C., (FIG. 5G) 80° C., and (FIG. 5H) 90° C., showing initial increase in transfer ratio with substrate temperature due to substrate drying, and subsequent increase in domain sizes at higher temperature due to thermal restructuring.
Figures 5C, 5D:
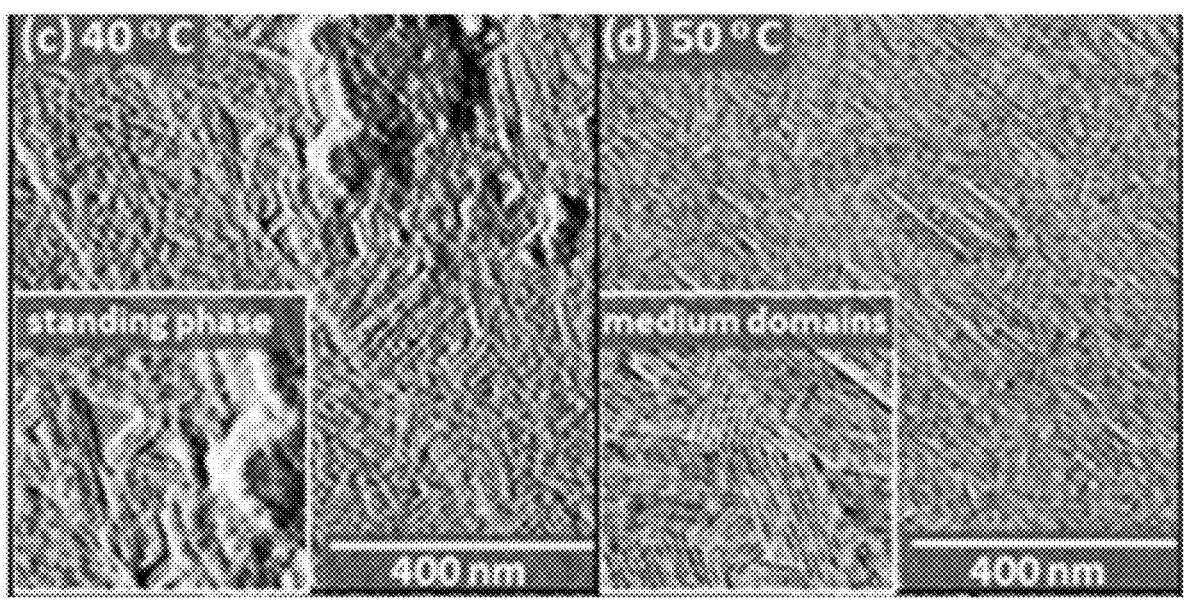
Figures 5E, 5F:
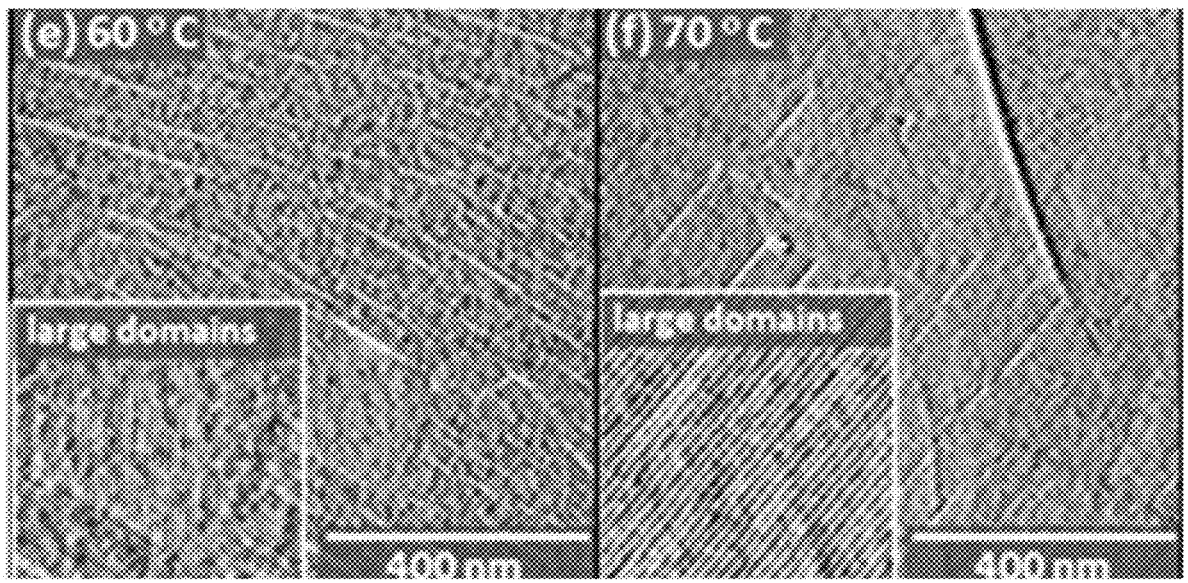
Figures 5G, 5H:
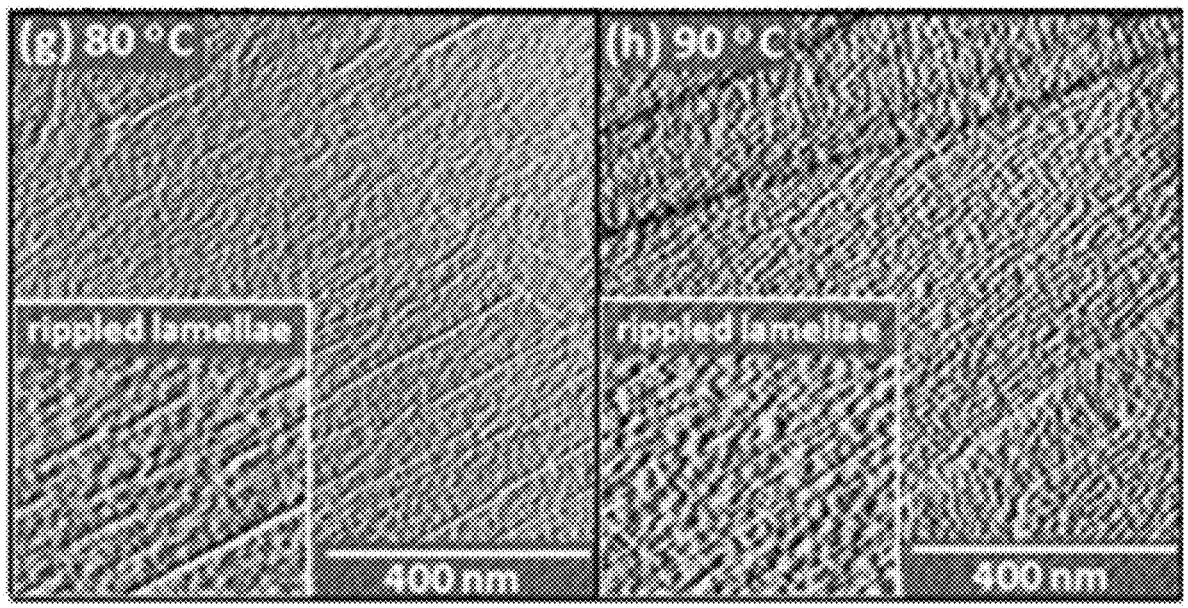

To establish an optimum temperature range for transfer and annealing to create large ordered domains, we performed a series of transfers with in situ thermal control at set-point temperatures from 30-90° C. AFM images (FIGS. 5A-5H) illustrate that heating the substrate slightly above the ambient temperature increases the transfer ratio, with many small domains (<100 nm edge length). At temperatures <50° C. (FIGS. 5A-5C), a mixture of vertically and horizontally oriented molecular domains is observed. At temperatures of 50-70° C. (FIGS. 5D-5F), standing phases are no longer observed, and larger ordered domains of horizontally-oriented striped phases are formed, with edge lengths up to 1 µm. At temperatures >70° C. (FIGS. 5G-5H), long domain edges are still observed, but there is an increased instance of small-domain inclusions, as well as increased undulations in the lamellar axis, suggesting instances of thermal polymerization (Chance, R R, et al., *J. Am. Chem. Soc.* 1978, 100, 1307-1309) and possibly thermochromic phase transitions (corresponding to undulations in the lamellar axis) at the highest temperatures tested (Carpick, R W, et al., *Langmuir* 2000, 16, 4639-4647).

Figure 6D:
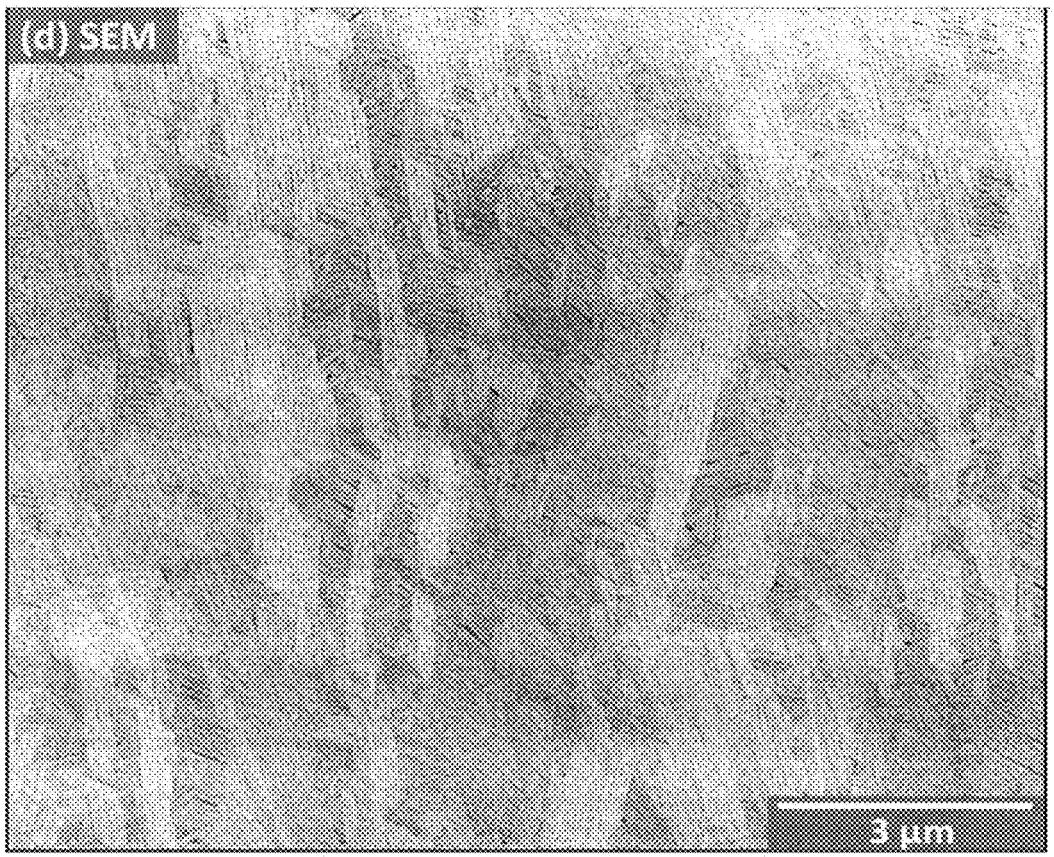
Figure 7A:
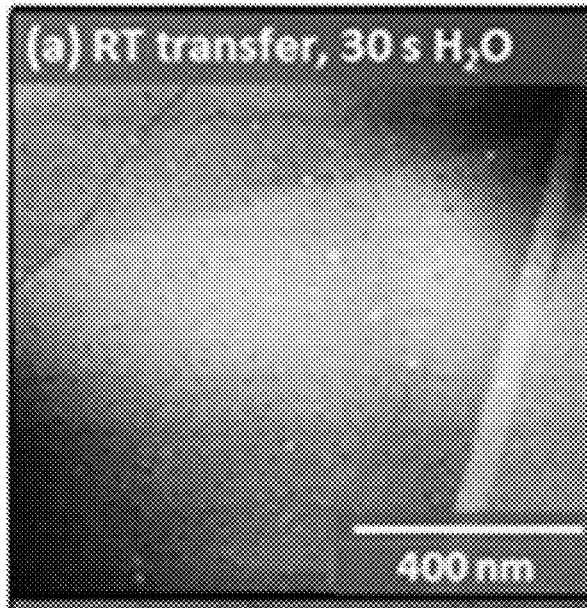
Figure 7B:
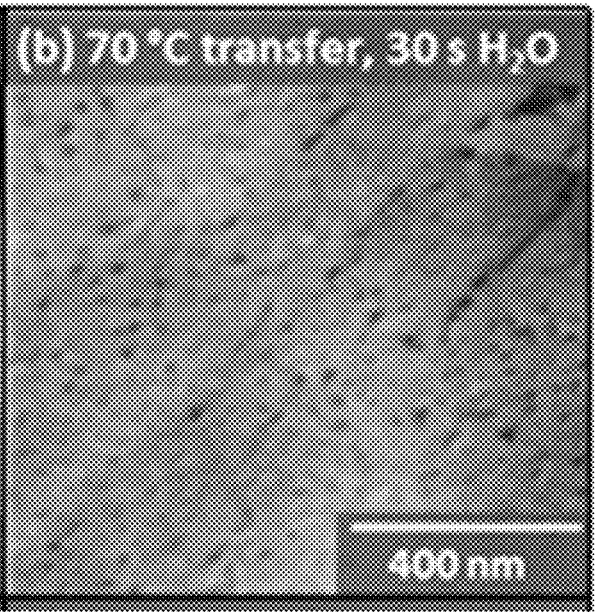
Figure 7C:
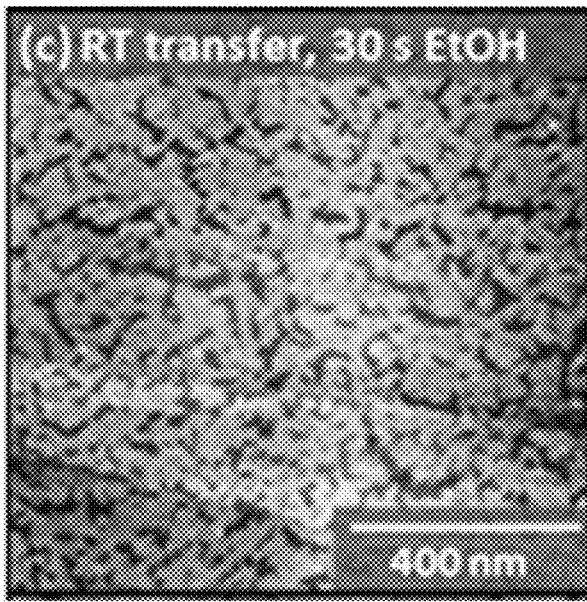
Figure 7D:
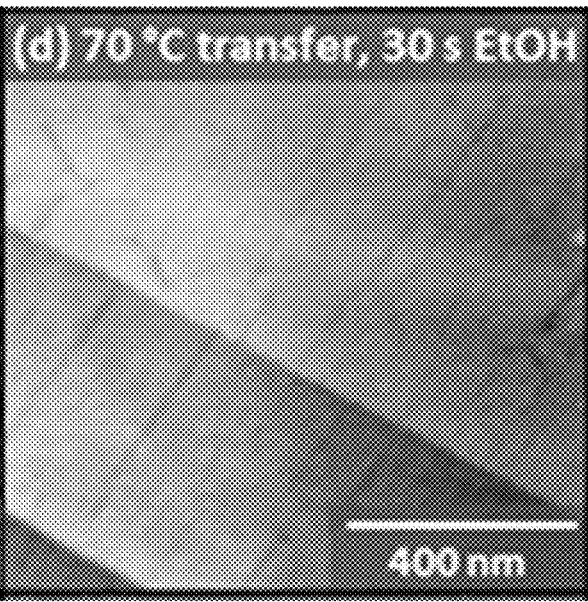

Optimized transfer at set-point temperatures near 70° C. (FIGS. 6A-6D) results in routine transfer of domains with edge lengths exceeding 3 µm, substantially greater than domain sizes when room temperature substrates are used for transfer. In FIG. 6A, an AFM phase image exhibits characteristic long-range molecular ordering, based on aligned monolayer features that extend from the upper right corner of the image to the middle left. FIG. 6B shows an AFM topography image acquired in the outlined area of FIG. 6A, with visible cracking defects. Such features are commonly observed in high-efficiency topochemical polymerization processes in which molecular conformational changes occur during polymerization (in this case, rehybridization of the internal diyne to form the ene-yne polymer backbone). Here, such features occur with a periodicity on the order of 50 nm. In molecular models (FIG. 6C) lamellae narrow by ~0.2 nm during polymerization; thus, the observed cracking dimensions suggest a high degree of polymerization. Previous studies of solid-state polymerization of smaller diynes (e.g. diacetylene-bis(toluenesulfonate)) have demonstrated a reaction rate increase of over 2 orders of magnitude when the material reaches ~10-20% conversion, due to strain accrual based on the difference between monomer and polymer lattice parameters (Bassler, H, *Advances in Polymer Science* 1984, 63, 1-48). We have not routinely observed cracking defects in the smaller domains formed through room-temperature transfer, and it is possible that one of the impacts of in situ thermal annealing is to increase molecular alignment in ways that improve polymerization efficiency.

The SEM image in FIG. 6D illustrates a typical distribution of domain sizes. Although we tested transfer times as long as 30 minutes, most ordering appears to occur within the first minute, and a more significant contributor to domain extent appears to be the size of terraces in the HOPG substrate. Step edges commonly represent nucleation points for domain growth, with assembly typically occurring perpendicular to the edge; in many cases, this has the effect of promoting domain alignment across step edges. Within large domains, we occasionally observe smaller domains with alternate epitaxial alignment, even at relatively long equilibration times, suggesting the possibility of occasional early chain polymerization events that preclude completion of domain alignment during annealing.

Because one of the goals of controlling molecular alignment over significant length scales is to improve robustness toward solution processing, we conducted a series of solvent washing assays using solvents with varying dielectric constants and surface tensions (FIG. 7A-7H). Samples were washed vigorously with a stream of water ($\varepsilon$=80.1, surface tension=72.4 mN/m), ethanol ($\varepsilon$=24.5, surface tension=22 mN/m), THF ($\varepsilon$=7.58 surface tension=26.4 mN/m), or toluene ($\varepsilon$=2.35, surface tension=28.4 mN/m), then blown dry with nitrogen. While all samples retain the majority of their surface coverage (for pre-washing images and intermediate time points, see Supporting Information), the greatest molecular losses occur for samples transferred at room temperature, undergoing washing with ethanol or THF. This is not entirely surprising, since these solvents are most similar to those commonly used to solvate lipid monomers.

To summarize, we have discovered that controlling substrate temperature during Langmuir-Schaefer conversion of a standing phase to a lying down phase can substantially increase both the extent of transfer and the size of ordered domains in noncovalent monolayers. Further, it was found that monolayers of diynoic phospholipids transferred through this in situ thermal annealing process of this invention exhibit enhanced stability toward vigorous washing with both polar and nonpolar solvents. Together these capabilities represent an important advance in the use of noncovalent monolayer chemistries in solution processing environments commonly used in various device preparations.

Those skilled in the art will recognize that numerous modifications can be made to the specific implementations described above. The implementations should not be limited to the particular limitations described. Other implementations may be possible.

While the inventions have been illustrated and described in detail in the drawings and foregoing description, the same is to be considered as illustrative and not restrictive in character, it being understood that only certain embodiments have been shown and described and that all changes and modifications that come within the spirit of the invention are desired to be protected.

It is intended that the scope of the present methods and apparatuses be defined by the following claims. However, it must be understood that this disclosure may be practiced otherwise than is specifically explained and illustrated without departing from its spirit or scope. It should be understood by those skilled in the art that various alternatives to the embodiments described herein may be employed in practicing the claims without departing from the spirit and scope as defined in the following claims.

What is claimed is:

1. A monolayer or thin film of an amphiphilic monomer with a hydrophilic headgroup and a hydrophobic tail ordered with the long molecular axis parallel to the surface of a supporting substrate to create a horizontally oriented striped interface prepared by an improved Langmuir-Schaefer (LS) method comprising the steps of a) preparing a solution of a component material for the monolayer or thin film of the amphiphilic monomer;
   b) trapping interfacially the monolayer or thin film at an air-water interface;
   c) preparing a supporting substrate;
   d) preparing a heating and temperature control system that is operatively connected to the supporting substrate; and
   e) transferring the monolayer or thin film of step b) to the supporting substrate of step c) with continuous heating of the supporting substrate at a controlled temperature of 50-70° C. during the transfer of the monolayer or thin film of the amphiphilic monomer, wherein the supporting substrate is a layered material positioned above the monolayer formed in step b),
      whereupon the horizontally oriented striped interface has ordered domains with edge lengths exceeding 3 μm at set-point temperatures near 70° C.

2. The monolayer or thin film of an amphiphilic monomer of claim 1, wherein the supporting substrate is operatively connected to the heating and temperature control system by a magnetic force.

3. The monolayer or thin film of an amphiphilic monomer of claim 1, wherein the supporting substrate is provided by a batch-wise operation or a continuous operation.

4. The monolayer or thin film of an amphiphilic monomer of claim 1, wherein the supporting substrate is a layered material.

5. The monolayer or thin film of an amphiphilic monomer of claim 4, wherein the supporting substrate is graphene, highly ordered pyrolytic graphite (HOPG), $MoS_2$, or $WS_2$.

6. The monolayer or thin film of an amphiphilic monomer of claim 1, wherein said monolayer or thin film is used to control orientation and/or phase segregation of a block copolymer.

7. The monolayer or thin film of an amphiphilic monomer of claim 6, wherein the block copolymer is used for a photovoltaic device.

8. The monolayer or thin film of an amphiphilic monomer of claim 1, wherein said monolayer or thin film is transferred to a flexible substrate for a wearable electronic device.

9. The monolayer or thin film of an amphiphilic monomer of claim 1, wherein said monolayer or thin film is used to create stacked films of the same or different kind.

10. The monolayer or thin film of an amphiphilic monomer of claim 1, wherein said monolayer or thin film is used to create a stacked film for an organic light-emitting diode.

11. The monolayer or thin film of an amphiphilic monomer of claim 1, which has enhanced stability toward vigorous washing with both polar and nonpolar solvents compared to a monolayer or thin film transferred to a substrate at room temperature.

* * * * *